United States Patent [19]

Ohno et al.

[11] Patent Number: 5,828,096

[45] Date of Patent: Oct. 27, 1998

[54] SEMICONDUCTOR DEVICE HAVING A CONTACT HOLE

[75] Inventors: Yoshikazu Ohno; Hiroki Shinkawata; Takahiro Yokoi, all of Hyogo, Japan

[73] Assignee: Mitsubishi Denki Kabushiki Kaisha, Tokyo, Japan

[21] Appl. No.: 726,314

[22] Filed: Oct. 2, 1996

[30] Foreign Application Priority Data

Mar. 29, 1996  [JP]  Japan .................................. 8-076320

[51] Int. Cl.[6] ........................................................ H01L 1/00
[52] U.S. Cl. ........................................ 257/306; 257/758
[58] Field of Search .................................... 257/758, 532, 257/774, 306

[56] References Cited

U.S. PATENT DOCUMENTS

| 4,905,064 | 2/1990 | Yabu et al. ............................. 257/306 |
| 5,378,652 | 1/1995 | Samata et al. . |
| 5,396,092 | 3/1995 | Peek ...................................... 257/758 |
| 5,488,246 | 1/1996 | Hayashide et al. . |
| 5,608,248 | 3/1997 | Ohno ..................................... 257/306 |

FOREIGN PATENT DOCUMENTS

| 1-80065 | 3/1989 | Japan ..................................... 257/306 |
| 03183162 A | 8/1991 | Japan . |

OTHER PUBLICATIONS

J.L. Vossen, W. Kern: Thin Film Processes, Academic Press, New York, San Franciso, London, 1978, pp. 417–424.

S. Wolf, R.N. Tauber: Silicon Processing for the VLSI Era, California, 1986, p. 534.

Primary Examiner—Minh-Loan Tran
Assistant Examiner—Roy Potter
Attorney, Agent, or Firm—McDermott, Will & Emery

[57] ABSTRACT

A semiconductor device appropriate for increased integrity in which occurrence of electrical short-circuit between a conductor for connecting a bit line and a semiconductor substrate and a gate electrode is obtained. In this semiconductor device, a first insulation layer, a second insulation layer, and a third insulation layer are formed between a first interconnection layer on the semiconductor substrate and a second interconnection layer. The etching rates of the first insulation layer and the second insulation layer are lower than the etching rate of the third insulation layer.

12 Claims, 12 Drawing Sheets

SEMICONDUCTOR DEVICE HAVING A CONTACT HOLE

BACKGROUND OF THE INVENTION

1. Field of the Invention

The present invention relates to a semiconductor device, and more particularly to a semiconductor device having a contact hole.

2. Description of the Background Art

As can be seen from the fact that DRAM (Dynamic Random Access Memory) and the like are being integrated to a higher degree, the degree of integration for semiconductor devices is increasing recently. As the elements incorporated into a semiconductor device are integrated to a higher degree, interconnection layers are required to be more and more miniaturized and formation of an even more miniaturized memory cells are required.

FIG. 16 is a cross-sectional view showing a conventional DRAM. Referring to FIG. 16, an isolating oxide film 2 for element isolation is formed at the surface portion of a semiconductor substrate 1 in this conventional DRAM. In addition, a word line (gate electrode) 4 is formed at a prescribed portion on the main surface of semiconductor substrate 1 with a gate oxide film 3 therebetween. Separated at isolating oxide film 2, the left hand side of the drawing shows a memory device region 70A while the right hand side shows a peripheral circuit region 70B.

On gate electrode 4, an anti-reflection film 5 having a lower reflectance regarding exposure light than gate electrode 4 is formed. Owing to this anti-reflection film 5, a resist pattern can be formed in a more miniaturized manner at the upper portion of this anti-reflection film 5, resulting in formation of more miniaturized word line 4. At the side surface of gate oxide film 3, gate electrode 4 and anti-reflection film 5, a sidewall spacer 8 is formed. A transistor 50 is formed by gate oxide film 3, gate electrode 4, anti-reflection film 5, sidewall spacer 8, and impurity diffusion regions 7 forming source/drain regions formed at the surface portion of semiconductor substrate 1. Word line 4 and anti-reflection film 5 are also formed on isolating oxide film 2, and sidewall spacer 8 is formed at the sidewall of word line 4 and anti-reflection film 5.

In addition, an insulation layer 10 is formed to cover transistor 50. At a prescribed region of this insulation layer 10, a bit line 19 which is the interconnection layer is formed. Bit line 19 is electrically connected to impurity diffusion region 7 within a contact hole 31 provided at insulation layer 10, by a conductor 17. In peripheral circuit region 70B, an interconnection layer 20 and impurity diffusion region 7 are also connected electrically by conductor 18 in a contact hole 16 formed at insulation layer 10.

An insulation layer 21 is formed to cover insulation layer 10, bit line 19 and interconnection layer 20. A capacitor 51 consisting of a storage node (i.e. capacitor lower electrode) 23, a dielectric film 24 and a cell plate (i.e., capacitor upper electrode) 25 is formed on insulation layer 21. Storage node 23 of this capacitor 51 is electrically connected to impurity diffusion region 7 by a conductor 22 formed in contact hole 36 which is formed at insulation layers 10 and 21. On capacitor 51, an insulation layer 35 is further formed, and on this insulation layer 35 is formed an interconnection layer 26. Interconnection layer 26 is connected electrically to an inner interconnection (not shown) at portions other than the cross-section shown in FIG. 16. At peripheral circuit region 70B, interconnection layer 26 and impurity diffusion region 7 are connected electrically with each other through a contact hole 24 formed in insulation layers 10, 21, and 35.

The structure of the conventional semiconductor device is as described above, and in such a structure, electric charge is stored in capacitor 51 or the charge stored in capacitor 51 is read out to bit line 19, according to transistor 51 being turned on or off. In the conventional semiconductor device as described above, conductor 17 for electrically connecting bit line 19 and impurity diffusion region 7 must be formed while avoiding gate electrode 4, in a stacked type DRAM. However, as the memory cells are being more miniaturized, it has become more difficult to form conductor 17 without bringing it into contact with gate electrode 4. When providing contact hole 31 for forming conductor 17, sidewall spacer 8 may also be subjected to etching as shown in FIG. 17. As a result, conductor 17 and gate electrode 4 would be brought into electrical connection, causing bit line 19 and gate electrode 4 to be short-circuited electrically. In addition, there also is a disadvantage that conductor 22 and gate electrode 4 would be in electrical contact between transistor 50 and conductor 22 for electrically connecting storage node 23 of capacitor 51 and impurity diffusion region 7, due to the same reason described above. Accordingly, there also has been a problem that a storage node 23 and gate electrode 4 would be electrically short-circuited.

SUMMARY OF THE INVENTION

An object of the present invention is to provide a semiconductor device appropriate for integration to a higher degree, in which a gate electrode and a bit line would not be electrically short-circuited.

Another object of the present invention is to provide a semiconductor device appropriate for integration to a higher degree, in which a gate electrode and a storage node would not be electrically short-circuited.

A semiconductor device according to one aspect of the present invention includes a first interconnection layer, a first insulation layer, a second insulation layer, a third insulation layer, a second interconnection layer, a first contact hole and a first conductor. The first interconnection layer is formed on a main surface of a semiconductor substrate while the first insulation layer is formed on the first interconnection layer. The second interconnection layer is formed on the first insulation layer, the third insulation layer on the second insulation layer and the second interconnection layer on the third insulation layer, respectively. The first contact hole is formed by etching between the second interconnection layer and the semiconductor substrate. The first conductor is formed in the first contact hole, providing connection between the second interconnection layer and the semiconductor substrate and being electrically insulated from the first interconnection layer. The etching rate of the first insulation layer and the etching rate of the second insulation layer are lower than the etching rate of the third insulation layer. Thus, the first contact hole for connecting the second interconnection layer and the semiconductor substrate can be formed in a self-aligned manner with respect to the first interconnection layer. As a result, the second interconnection layer and the first interconnection layer would not be electrically short-circuited even when the semiconductor device is integrated to a higher degree.

In the structure of the semiconductor device according to above-described one aspect, a fourth insulation layer may be provided between the first interconnection layer and the first insulation layer. In this way, bad influence on the property of the transistor due to high mechanical stress at the first insulation layer can be mitigated.

In addition, the semiconductor device according to above-described one aspect may also include a fifth insulation layer between the semiconductor substrate and the second insulation layer. In this way, there would be no damage to the semiconductor substrate when etching the second insulation layer.

Furthermore, in the structure of the semiconductor device according to above-described one aspect, the shapes of the first insulation layer and the first interconnection layer may be substantially the same in a plane view. In such a structure, the width of the first insulation layer and the width of the first interconnection layer would be substantially the same, thus enabling simultaneous formation of the first insulation layer and the first interconnection layer while suppressing occurrence of electrical short-circuit between the first conductor and the first interconnection layer (i.e., gate electrode) as well as increase in the contact resistance.

Moreover, in the structure of the semiconductor device according to the above-described first aspect, the reflectance of the first insulation layer regarding exposure light may be made lower than the reflectance of the first interconnection layer so as to suppress the reflection of light as compared to the case of the first interconnection layer. In this way, a more miniaturized resist pattern will be formed at the upper portion of the first insulation layer to form a more miniaturized first interconnection layer (i.e., word line).

In addition, in the structure of the semiconductor device according to above-described one aspect, a sixth insulation layer, a conductive layer, a second contact hole, and a second conductor may be provided, and the etching rate of the first insulation layer and the etching rate of the second insulation layer may be made lower than the etching rate of the sixth insulation layer. In this case, the sixth insulation layer is formed on the second insulation layer, and the conductive layer is formed on the sixth insulation layer. The second contact hole is formed by etching between the conductive layer and the semiconductor substrate. The second conductor is formed in the second contact hole, and provides connection between the conductive layer and the semiconductor substrate while being insulated electrically from the first interconnection layer. By making the etching rates of the first and second insulation layers lower than the etching rate of the sixth insulation layer in this way, the second contact hole for connecting the conductive layer and the semiconductor substrate can be formed faster and more efficiently. Since the etching rates of the first and second insulation layers are made lower than the etching rate of the third insulation layer, the second contact hole for providing connection between the conductive layer and the semiconductor substrate can be formed in a self-aligned manner with respect to the first interconnection layer, thus preventing occurrence of an electrical short-circuit of the conductive layer and the first interconnection layer even in a semiconductor device which is integrated to a higher degree.

In the structure of the semiconductor device according to above-described one aspect, the first contact hole may include a lower contact hole portion and an upper contact hole portion. In this case, the lower contact hole portion has a first opening diameter while the upper contact hole portion is located above the lower contact hole portion and has a second opening diameter larger than the first opening diameter.

In addition, in the semiconductor device according to the above-described one aspect, the conductive layer may form a capacitor lower electrode, the first conductor and the second interconnection layer may form a bit line, and the first interconnection layer may form a gate electrode. In this case, the structure may further include a capacitor upper electrode formed on the upper surface and the side surface of the capacitor lower electrode with capacitor insulation film therebetween. Also, the capacitor lower electrode and the bit line may be formed to overlap one another in this structure. Moreover, the bit line and the capacitor lower electrode may be formed to be arranged in a T-shape, and the upper portion of the capacitor lower electrode extending horizontally may be formed above the upper portion of the bit line extending horizontally.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following, with reference to the figures.

Embodiment 1

Figure 1:
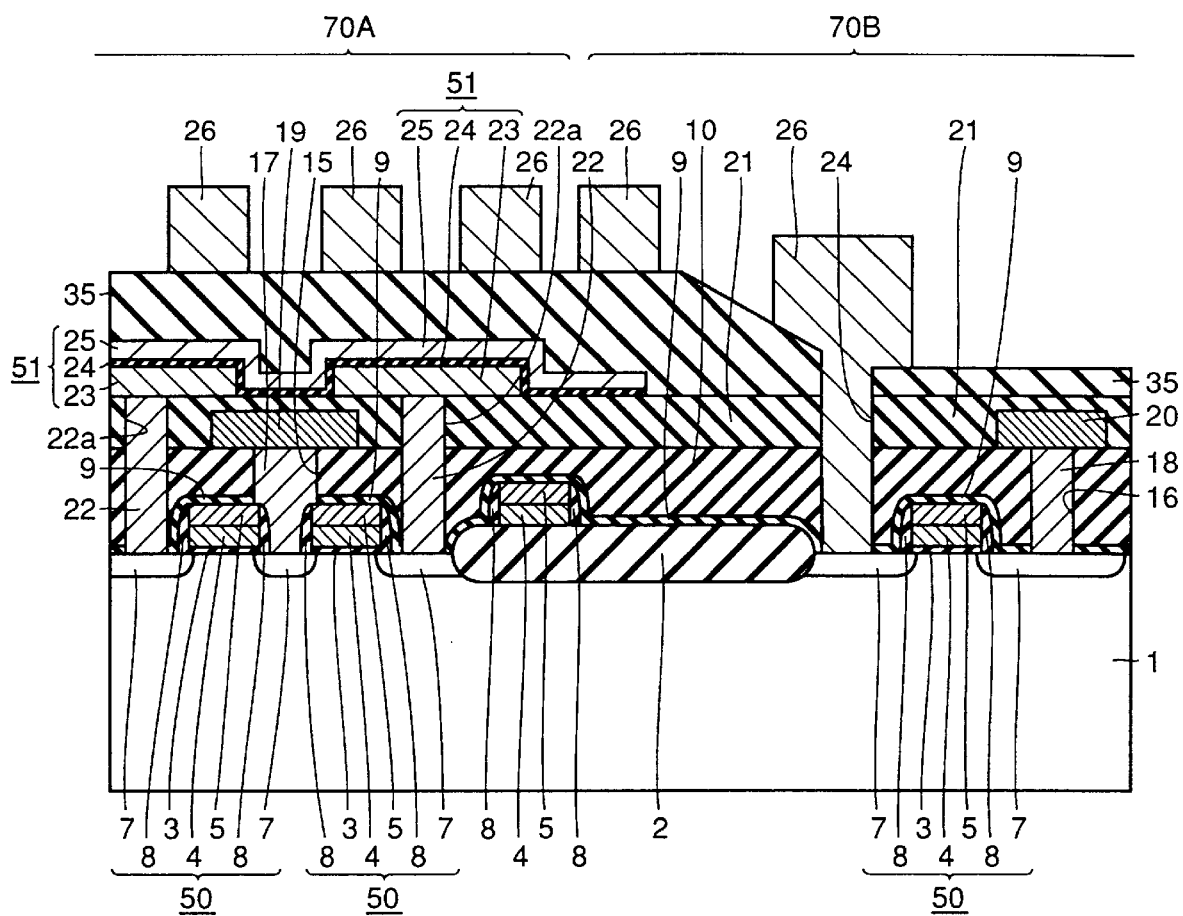
FIG. 1 is a cross-sectional view showing a semiconductor device according to Embodiment 1 of the present invention.

Referring to FIG. 1, in the semiconductor device according to this Embodiment 1, an isolating oxide film 2 for element isolation is formed at the surface portion of a semiconductor substrate 1. A word line (i.e., gate electrode) 4 forming a first interconnection layer is formed at a prescribed region on the main surface of semiconductor substrate 1 via a gate oxide film 3. Separated by isolating oxide film 2, the left hand side of the drawing represents a memory device region 70A and the right hand side represents a peripheral circuit region 70B.

An anti-reflection film (i.e., first insulation layer) 5 is formed on gate electrode 4. Anti-reflection film 5 has reflectance regarding exposure light lower than that of gate electrode 4. Owing to anti-reflection film 5, the resist pattern at the upper portion of this anti-reflection film 5 can be formed in a more miniaturized manner, resulting in formation of a more miniaturized word line 4. At the side surface of gate oxide film 3, gate electrode 4 and anti-reflection film 5, sidewall spacer 8 is formed. A transistor 50 is formed by gate oxide film 3, gate electrode 4, anti-reflection film 5, sidewall spacer 8, and impurity diffusion regions 7 constituting source/drain regions formed at the surface portion of semiconductor substrate 1. Word line 4 and anti-reflection film 5 are also formed on isolating oxide film 2, and sidewall spacer 8 is formed at their sidewalls.

A second insulation layer 9 is formed to cover transistor 50. A third insulation layer 10 is formed on this second insulation layer 9. Here, in the semiconductor device according to Embodiment 1, the etching rates of first insulation layer 5 and second insulation layer 9 are lower than the etching rate of the third insulation layer 10. A bit line 19 which is the second interconnection layer formed on the third insulation layer 10 is electrically connected to impurity diffusion region 7 by a first conductor 17 in a first contact hole 15. Electrical connection is also provided between an interconnection layer 20 and impurity diffusion region 7 by a conductor 18 in a contact hole 16 at peripheral circuit region 70B.

A sixth insulation layer 21 is formed on third insulation layer 10, and on the sixth insulation layer 21 is formed a capacitor 51 consisting of a storage node (i.e., capacitor lower electrode) 23, a dielectric film 24 and a cell plate (i.e., capacitor upper electrode) 25. Storage node 23 of this capacitor 51 is electrically connected to impurity diffusion region 7 by a second conductor 22 in a second contact hole 22a. An insulation layer 35 is further formed on capacitor 51, and an interconnection layer 26 is formed on this insulation layer 35. This interconnection layer 26 is in electrical connection with an inner interconnection (not shown) at portions other than the cross-section shown in FIG. 1. In peripheral circuit region 70B, interconnection layer 26 and impurity diffusion region 7 are connected electrically via a contact hole 24.

Referring next to FIGS. 2 to 11, a method of manufacturing the semiconductor device according to Embodiment 1 will be described.

Figure 2:
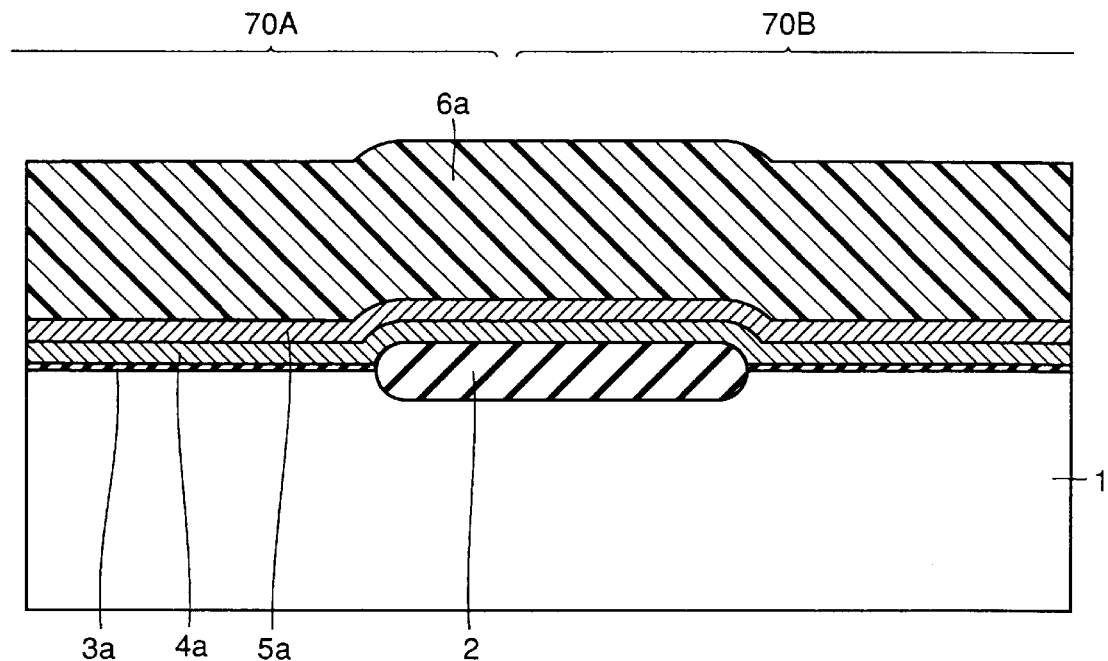
FIGS. 2 to 11 are cross-sectional views showing first to tenth step in a method of manufacturing the semiconductor device according to Embodiment 1 in FIG. 1.
Figure 3:
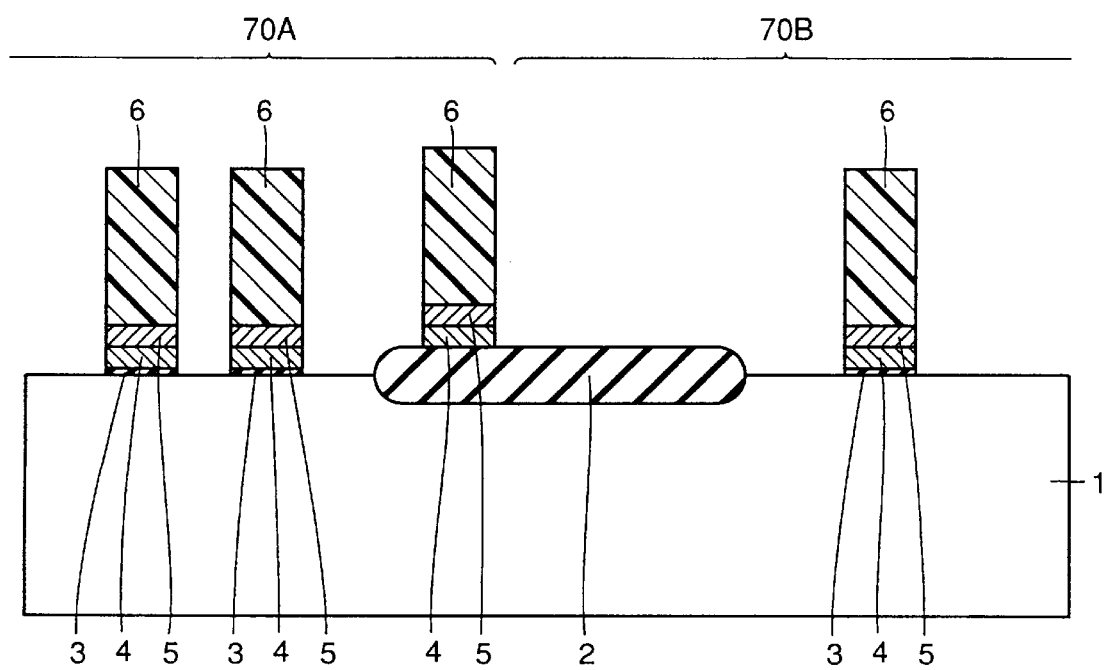

First, as shown in FIG. 2, isolating oxide film 2 is formed by LOCOS (Local Oxidation of Silicon) on silicon substrate 1 which is the semiconductor substrate. A silicon dioxide film 3a and a polycrystalline silicon film 4a containing impurity are formed successively on the surface of silicon substrate 1. A film 5a of silicon oxynitride (SiON) film or silicon nitride ($Si_3N_4$) film having a thickness of 10 to 100 nm is formed on polycrystalline silicon film 4a by CVD (Chemical Vapor Deposition). This film 5a suppresses reflection of light more efficiently as compared to the above-described polycrystalline silicon film 4a containing impurity, and has an etching rate lower than that of silicon dioxide film (i.e., the third insulation layer) 10 described below. A resist 6a is applied on film 5a. A resist layer 6 having a pattern of the word line as shown in FIG. 3 is formed by photolithography.

Thereafter, resist layer 6 is used as a mask to perform an etching, thereby forming gate oxide film 3 of silicon dioxide, gate electrode (i.e., word line) 4 of polycrystalline silicon containing impurity and anti-reflection film 5 of silicon oxynitride film or silicon nitride film having a thickness of 10 to 100 nm.

Figure 4:
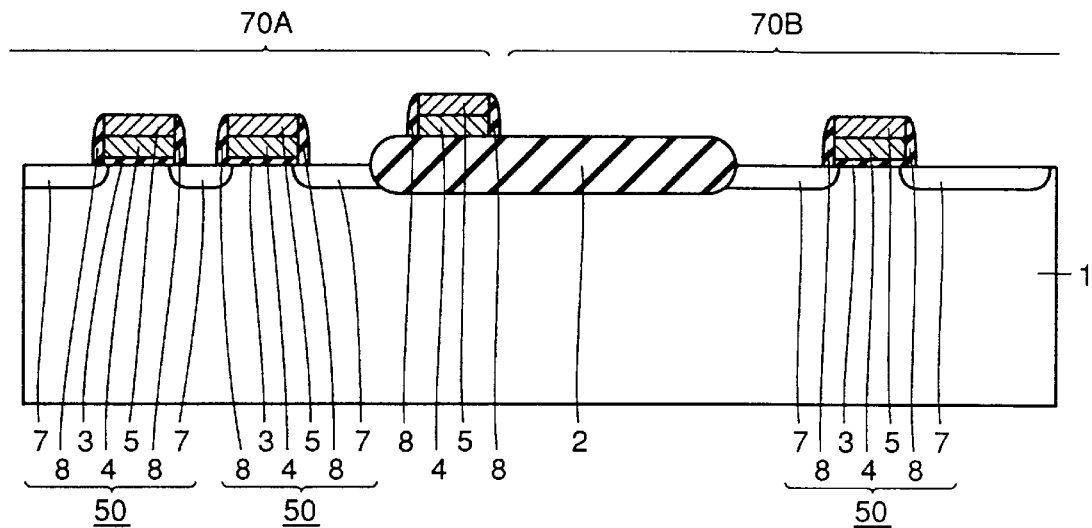

After removing resist layer 6, anti-reflection film 5 and isolating oxide film 2 are used as a mask for ion implantation, thereby forming impurity diffusion region 7 which is to be the source/drain as shown in FIG. 4. Then, a silicon dioxide film (not shown) is deposited entirely on the surface using CVD or the like and is then subjected to anisotropical etching for etching back the entire surface of the silicon dioxide film. Thus, sidewall spacer 8 of silicon dioxide is formed at both sides of gate oxide film 3, gate electrode (i.e., word line) 4 and anti-reflection film 5. In this way, MOS transistor 50 is formed. In addition, sidewall spacer 8 of silicon dioxide is formed at the sidewall of word line 4 and anti-reflection film 5 on isolating oxide film 2.

Figure 5:
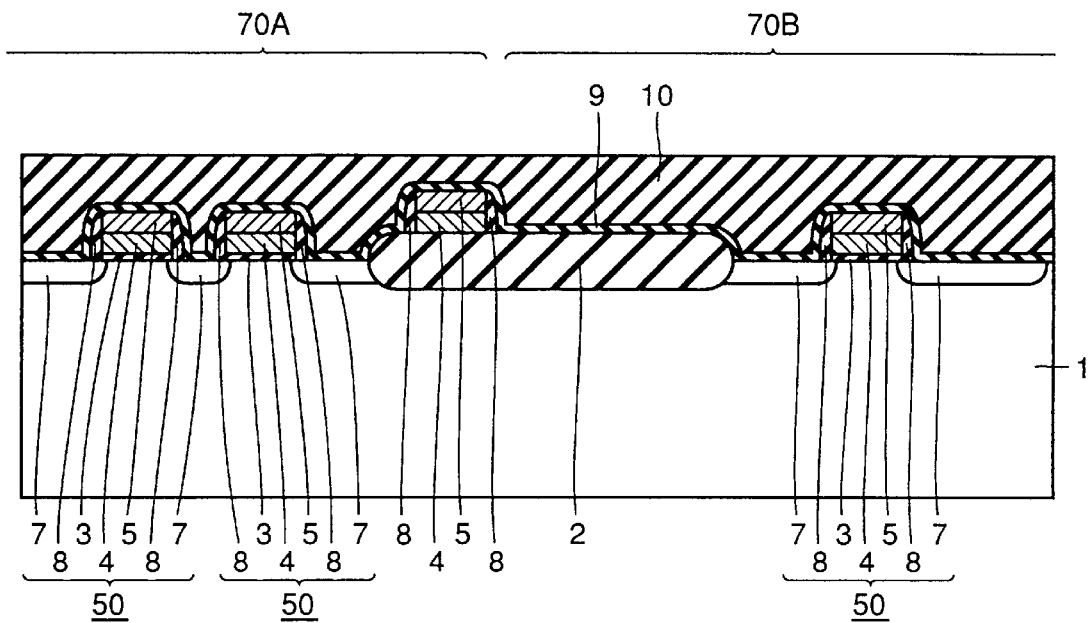
Figure 6:
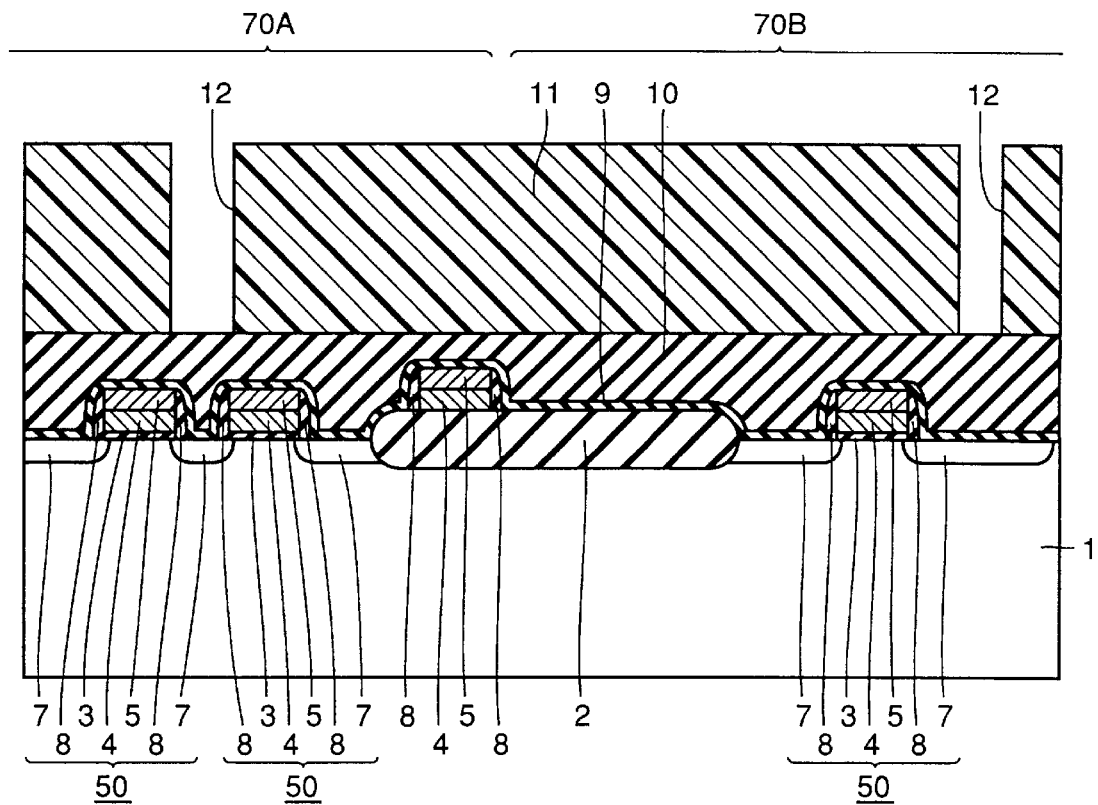

Thereafter, as shown in FIG. 5, second insulation layer 9 having a thickness of 10 to 50 nm of silicon nitride ($Si_3N_4$) or silicon oxynitride (SiON) is formed on the entire surface by CVD. Silicon dioxide layer (i.e., the third insulation layer) 10 having an even upper surface is formed on the second insulation layer 9. This silicon dioxide layer 10 has an etching rate higher than that of anti-reflection film (i.e., the first insulation layer) 5 and the second insulation layer 9.

Figure 7:
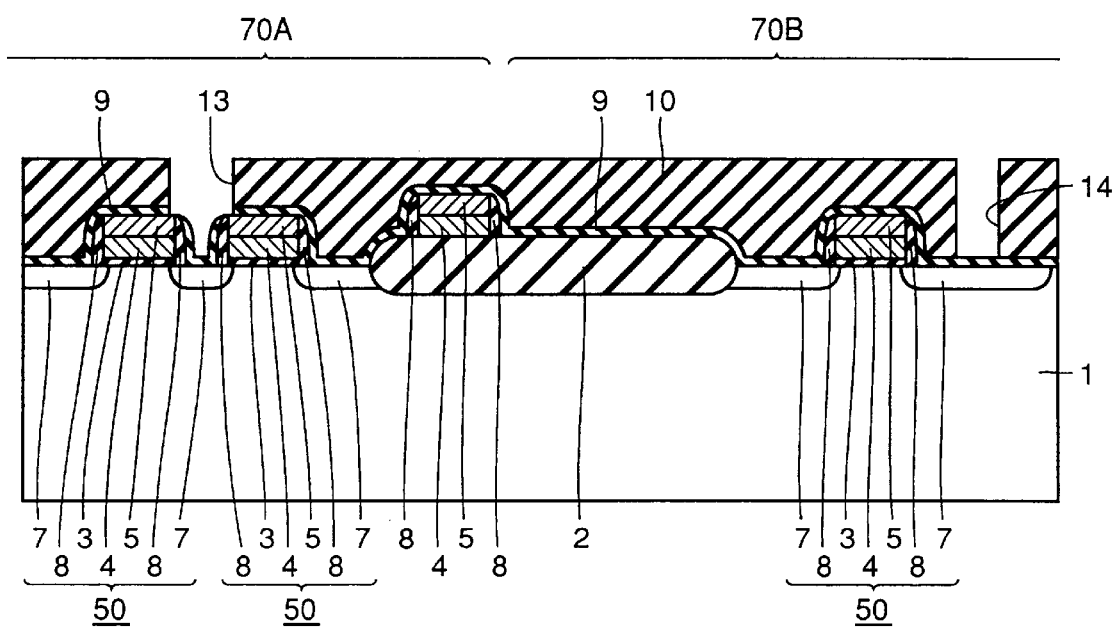

A resist 11 having an opening pattern 12 is formed on silicon dioxide layer 10 using photolithography. Using this resist 11 as a mask, an etching process of silicon dioxide with a high etching rate as compared to anti-reflection film 5 and second insulation layer 9 is employed so as to perform an etching on silicon dioxide layer 10. In this way, contact hole 13 as shown in FIG. 7 is formed. Contact hole 14 is also formed at peripheral circuit region 70B. Resist 11 is then removed.

As an etching process of silicon dioxide having a high etching rate with respect to the above-described silicon nitride or silicon oxynitride, a dry etching process using fluorocarbon system gas such as c-$C_4F_8$, $C_3F_8$, $C_3F_6$, $C_5F_{12}$, $C_4F_8$, $C_5F_{10}$, $CHF_3$ and mixed gas thereof, for example, may be employed. Furthermore, dry etching process using mixed gas of argon Ar, carbon monoxide CO, or oxygen $O_2$ or the like and fluorocarbon system gas, as well as mixed gas of argon AR, carbon monoxide CO, oxygen $O_2$ or the like and mixed gas of the above-described fluorocarbon system gases may be employed. When silicon dioxide layer 10 is removed at the portion of opening pattern 12 of resist 11 by this etching, second insulation layer 9 is also subjected to etching owing to overetching. As a result, even the upper surface of first insulation layer 5 is subjected to etching in some cases. However, since the etching rates for the second insulation layer 9 and first insulation layer 5 are lower than the etching rate for silicon dioxide layer (i.e., the third insulation layer) 10, second insulation layer 9 and first insulation layer 5 function as etching stopper. Thus, exposure of gate electrode 4 under first insulation layer 5 upon etching of silicon dioxide layer 10 can be prevented effectively.

Figure 8:
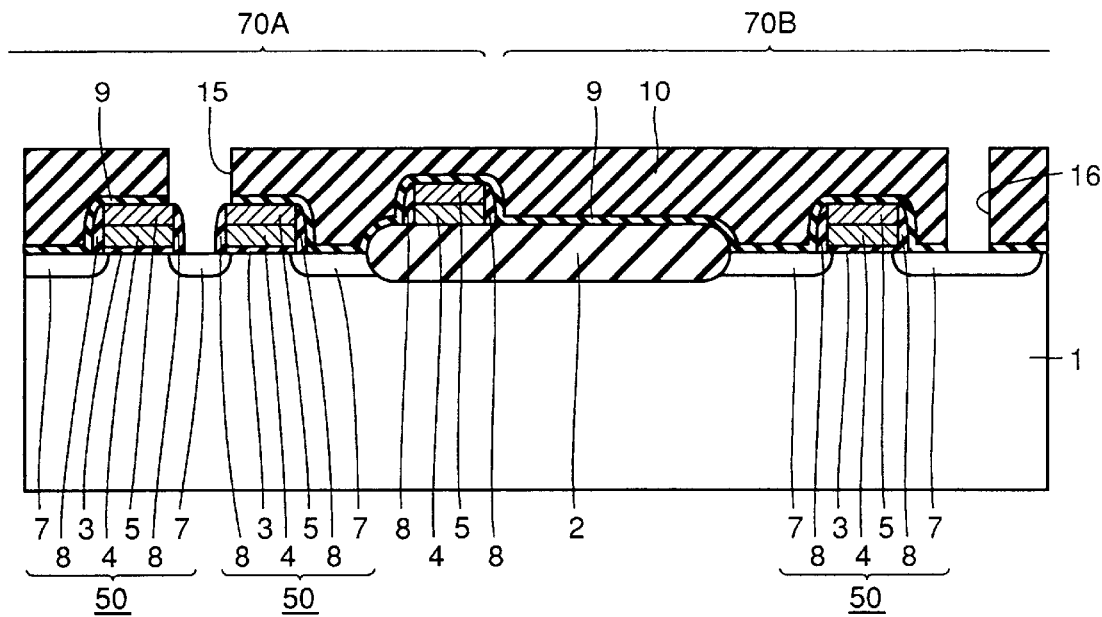

Then, as shown in FIG. 8, second insulation layer 9 is removed by dry etching using, for example, carbon tetrafluoride ($CF_4$) gas or the like to open first contact hole 15. Contact hole 16 is also opened at peripheral circuit region 70B.

Figure 9:
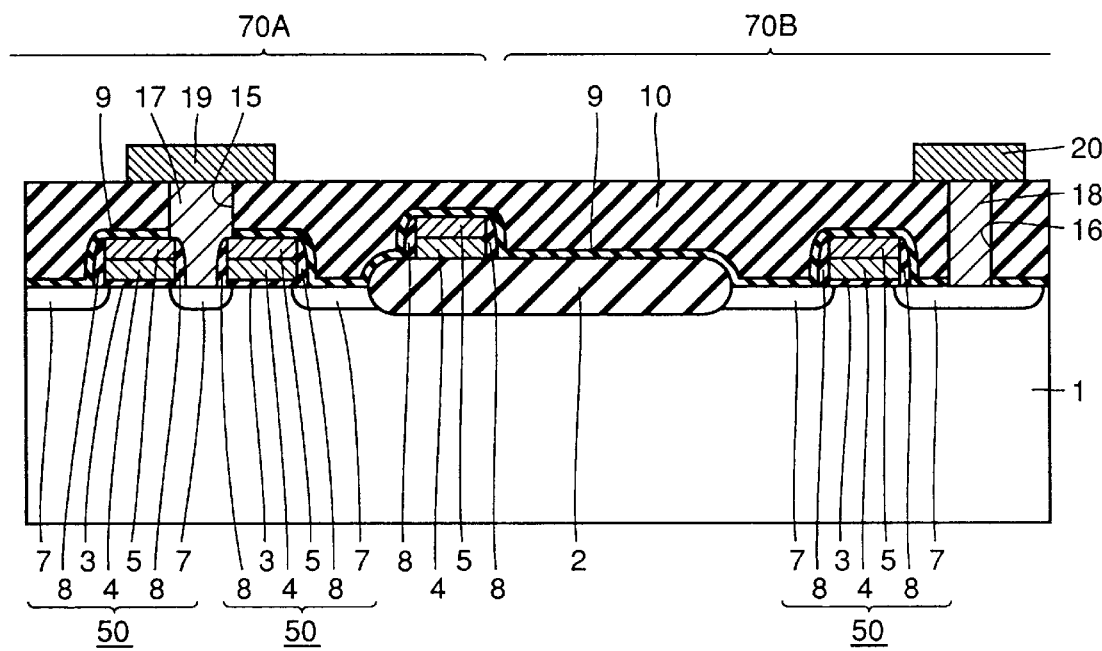

Thereafter, a polycrystalline silicon film (not shown) containing impurity is deposited entirely on the surface, and then first conductor 17 as shown in FIG. 9 is formed by etching back the entire surface. Then, second interconnection layer (i.e., bit line) 19 which is in connection with that first conductor 17 while extending over the upper surface of third insulation layer 10 is formed. Conductor 18 and interconnection layer 20 are formed also at peripheral circuit region 70B.

Figure 10:
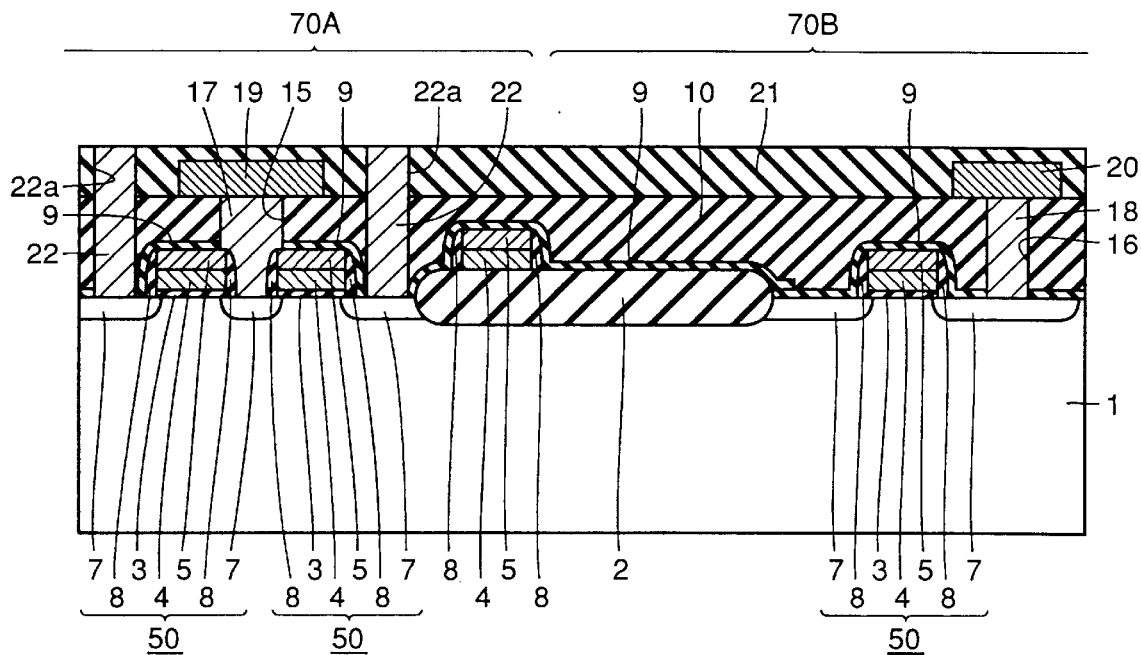

As shown in FIG. 10, sixth insulation layer 21 of silicon oxide film is formed by CVD. After forming a resist pattern (not shown) at the prescribed region on sixth insulation layer 21, this resist pattern is used as a mask to etch sixth insulation layer 21 and third insulation layer 10. Thus, second contact hole 22a reaching silicon substrate 1 is opened. Second conductor 22 is formed in this second contact hole 22a. When opening second contact hole 22a, etching process of silicon dioxide with high etching rate as compared to first insulation layer 5 of silicon oxynitride film or silicon nitride film and second insulation layer 9 of silicon nitride film or silicon oxynitride film is also employed, so as to perform an etching on sixth insulation layer 21 of silicon dioxide. Thus, second contact hole 22a can be formed faster and more efficiently.

Figure 11:
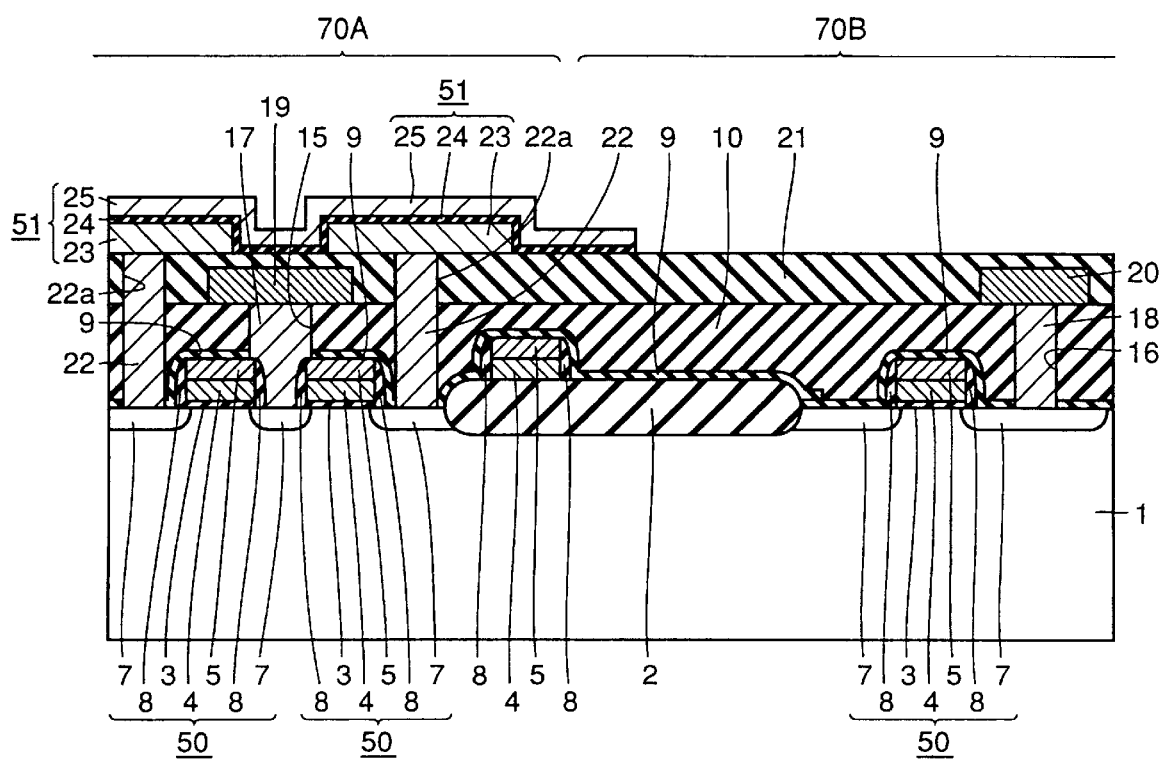

Thereafter, as shown in FIG. 11, storage node 23 constituting capacitor lower electrode, dielectric film 24 and cell plate 25 constituting capacitor upper electrode are formed on sixth insulation layer 21. Thus, capacitor 51 is formed. Cell plate 25 is formed on the upper surface and the side surface of storage node 23 via dielectric film 24.

Finally, an insulation layer 35 is deposited on the entire surface, contact hole 24 is opened at the peripheral circuit region 70B, and then interconnection layer 26 of aluminum or the like is formed, as shown in FIG. 1. Thus, the semiconductor device shown in FIG. 1 is formed.

As described above, in the manufacturing process of the semiconductor device according to Embodiment 1, when the step shown in FIG. 7 is performed in which silicon dioxide layer 10 is subjected to etching at the portion of opening pattern 12 of resist 11, over-etching causes the upper surface of first insulation layer 5 to be etched upon etching of second insulation layer 9. However, first insulation layer 5 and second insulation layer 9 both have a lower etching rate as compared to the third insulation layer (i.e., silicon dioxide layer) 10, so that first insulation layer 5 and second insulation layer 9 work as the etching stopper upon etching of third insulation layer 10. Thereafter, by etching away second insulation layer 9, disadvantage of occurrence of electrical short-circuit between bit line 19 and gate electrode 4 caused by electrical contact of conductor 17 and gate electrode 4 can be prevented effectively. In this way, first contact hole 15 for electrically connecting bit line 19 and silicon substrate 1 can be formed in a self-aligned manner with respect to gate electrode 4. As a result, a miniaturized memory cell in which there is no electrical short-circuit of bit line 19 and gate electrode 4 can also be formed in a DRAM which is integrated to a higher degree.

In addition, if the width of first insulation layer 5 is narrower than the width of gate electrode 4, occurrence of electrical short-circuit between conductor 17 and gate electrode 4 is likely. If the width of first insulation layer 5 is wider than the width of gate electrode 4, contact hole 15 is made narrow such that contact resistance is increased. Accordingly, the widths of first insulation layer 5 and gate electrode 4 are made substantially the same in this Embodiment 1 such that first insulation layer 5 and gate electrode 4 can be formed simultaneously and electrical short-circuit of first conductor 17 and gate electrode 4 would not be likely, preventing increase in contact resistance. In order to make the width of first insulation layer 5 and gate electrode 4 substantially the same, first insulation layer 5 and first interconnection layer (i.e., gate electrode) 4 are formed to have substantially the same shapes when viewed two dimensionally.

Embodiment 2

Figure 12:
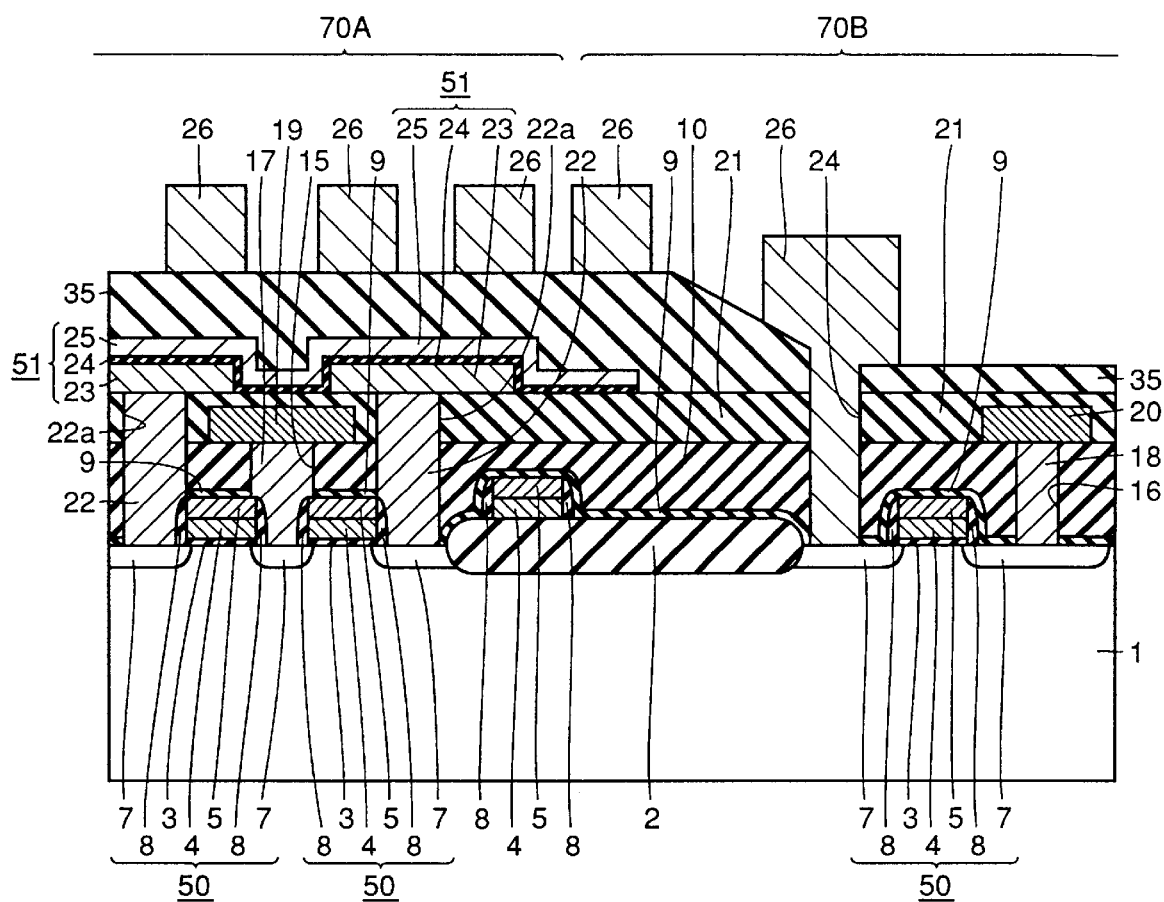
FIG. 12 is a cross sectional view showing a semiconductor device according to Embodiment 2 of the present invention.

Referring to FIG. 12, in a semiconductor device according to Embodiment 2 of the present invention, a second conductor 22 for electrically connecting a storage node 23 of a capacitor 51 and a silicon substrate 1 is formed in a self-aligned manner with respect to a gate electrode 4 via a second contact hole 22a, using a similar method as that of the above-described Embodiment 1. More specifically, the above-described second contact hole 22a is formed with a method similar to the method used for the first contact hole 15 according to Embodiment 1 described above. Thus, a miniaturized memory cell in which there is no electrical short-circuit of storage node 23 and gate electrode 4 can be formed also in a DRAM having a high integrity.

Embodiment 3

Figure 13:
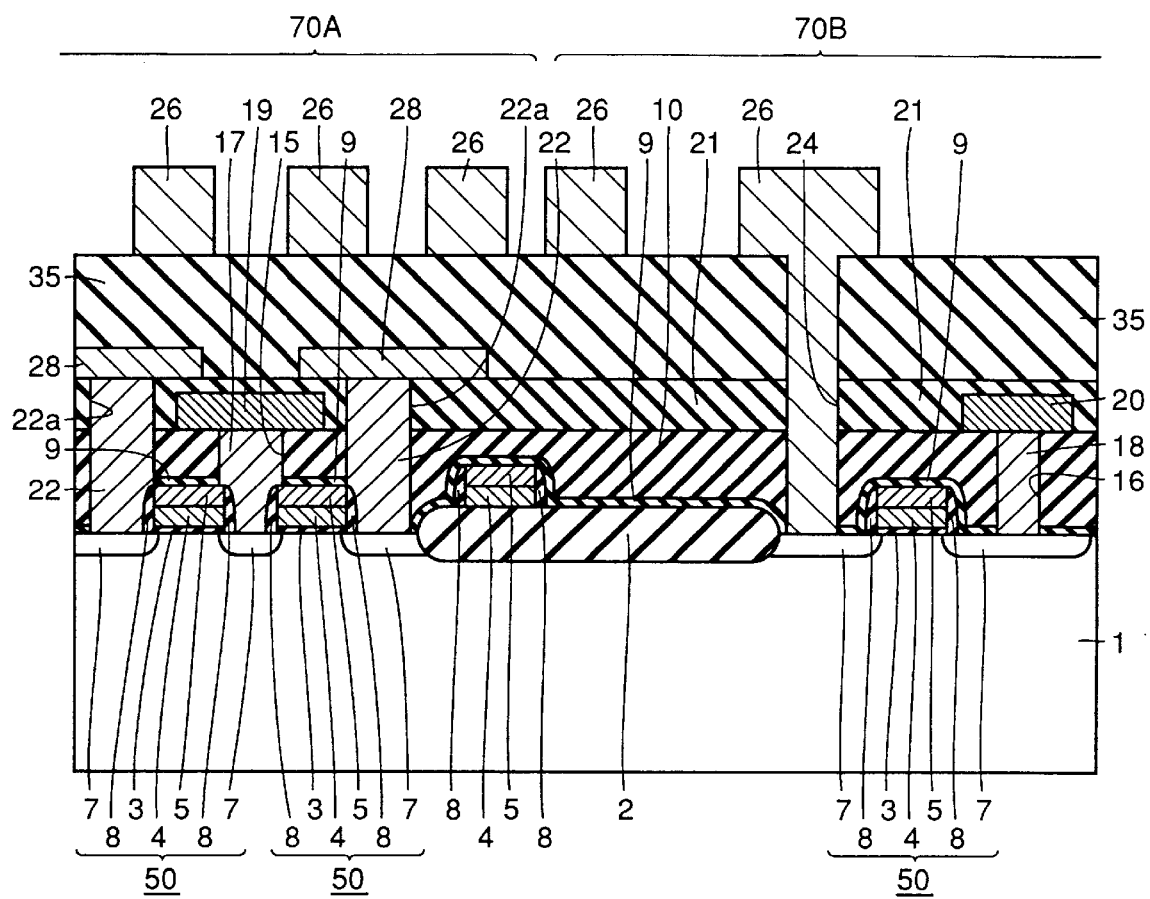
FIG. 13 is a cross-sectional view showing a semiconductor device according to Embodiment 3 of the present invention.

Referring to FIG. 13, in a semiconductor device according to Embodiment 3 of the present invention, capacitor 51 according to Embodiment 1 is modified to a third interconnection layer 28 of aluminum or the like while a second conductor 22 for electrically connecting that third interconnection layer 28 and a silicon substrate 1 is formed in a self-aligned manner with respect to a gate electrode 4. Thus, a miniaturized circuit in which there is no electrical short-circuit of third interconnection layer 28 forming an upper interconnection layer and gate electrode 4 can be formed also in a logic device which is integrated to a higher degree.

Embodiment 4

Figure 14:
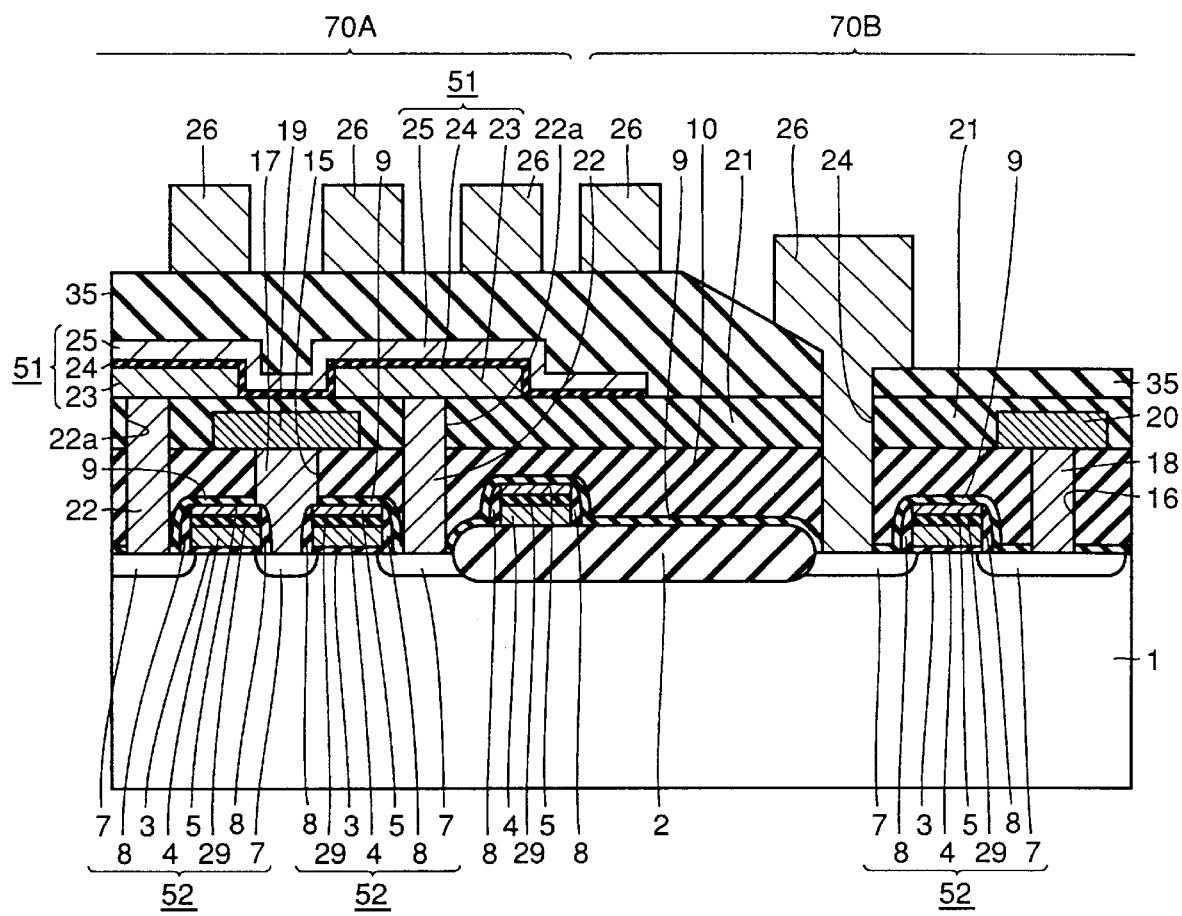
FIG. 14 is a cross-sectional view showing a semiconductor device according to Embodiment 4 of the present invention.

Referring to FIG. 14, in a semiconductor device according to Embodiment 4 of the present invention, a fourth insulation layer 29 of silicon dioxide film is formed between a first interconnection layer 4 forming a word line or a gate electrode and a first insulation layer 5 forming an anti-reflection film. This fourth insulation layer 29 is formed by, for example, CVD to have a thickness of about 15 nm. In this way, bad influence on the property of transistor 52 due to first insulation layer 5 can be mitigated as compared to the case in which first insulation layer 5 of silicon oxynitride film or silicon oxide film with a large mechanical stress is formed directly on gate electrode (i.e., word line)4.

Embodiment 5

Figure 15:
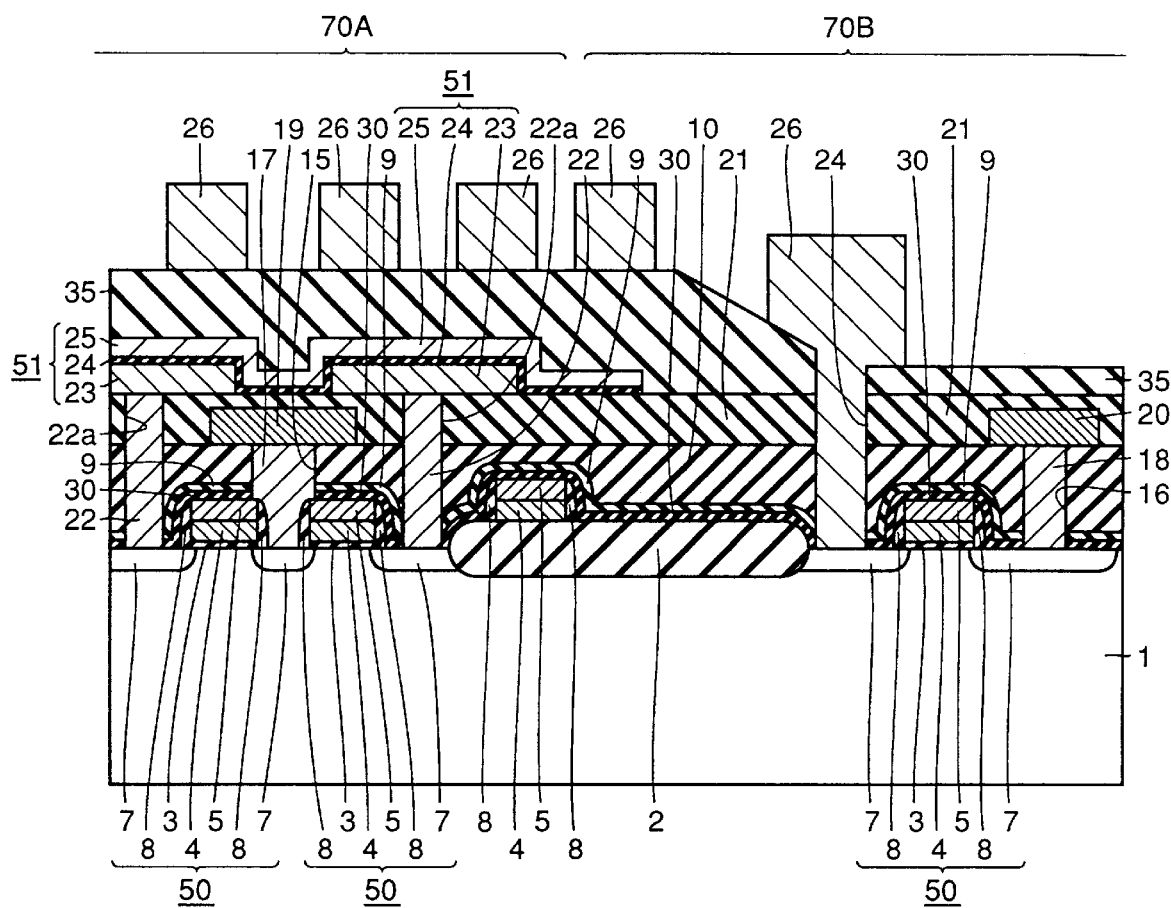
FIG. 15 is a cross-sectional view showing a semiconductor device according to Embodiment 5 of the present invention.
Figure 16:
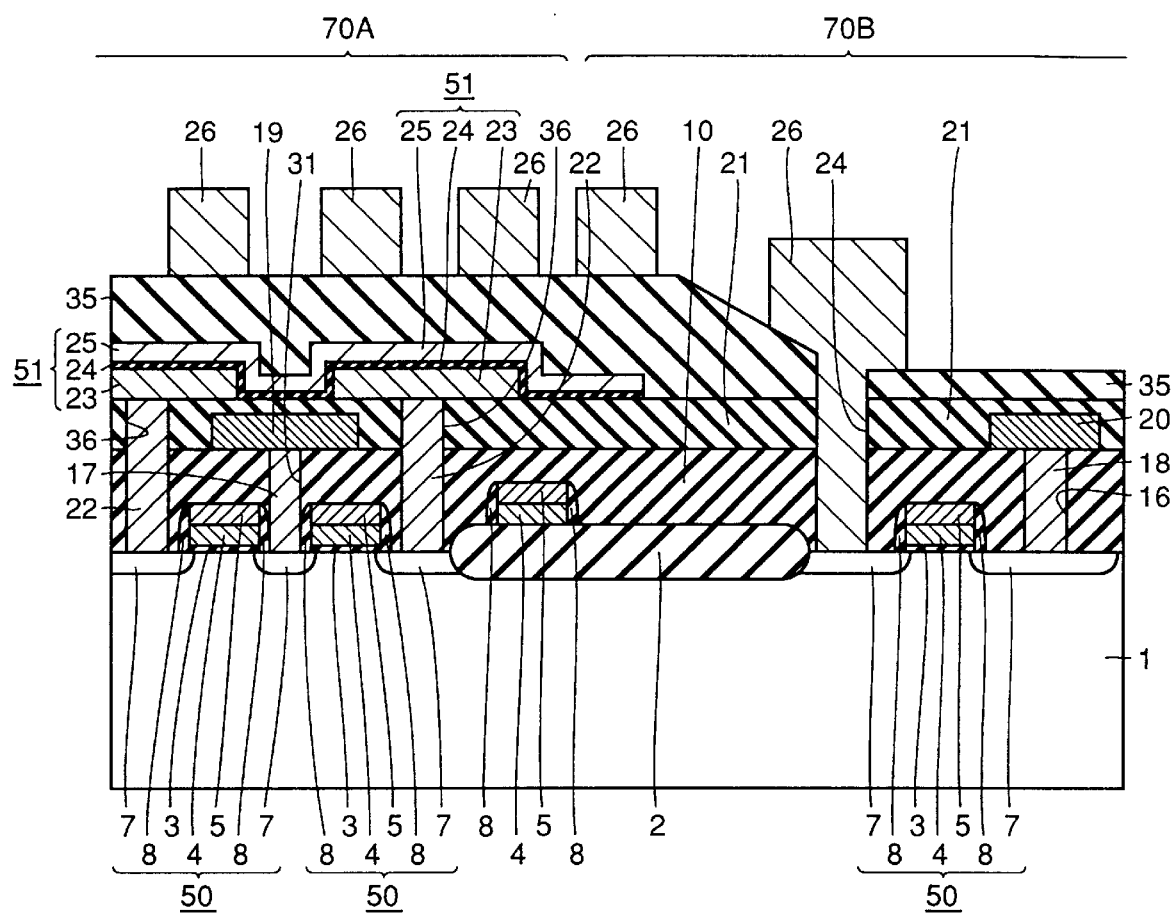
FIG. 16 is a cross-sectional view showing a conventional semiconductor device.
Figure 17:
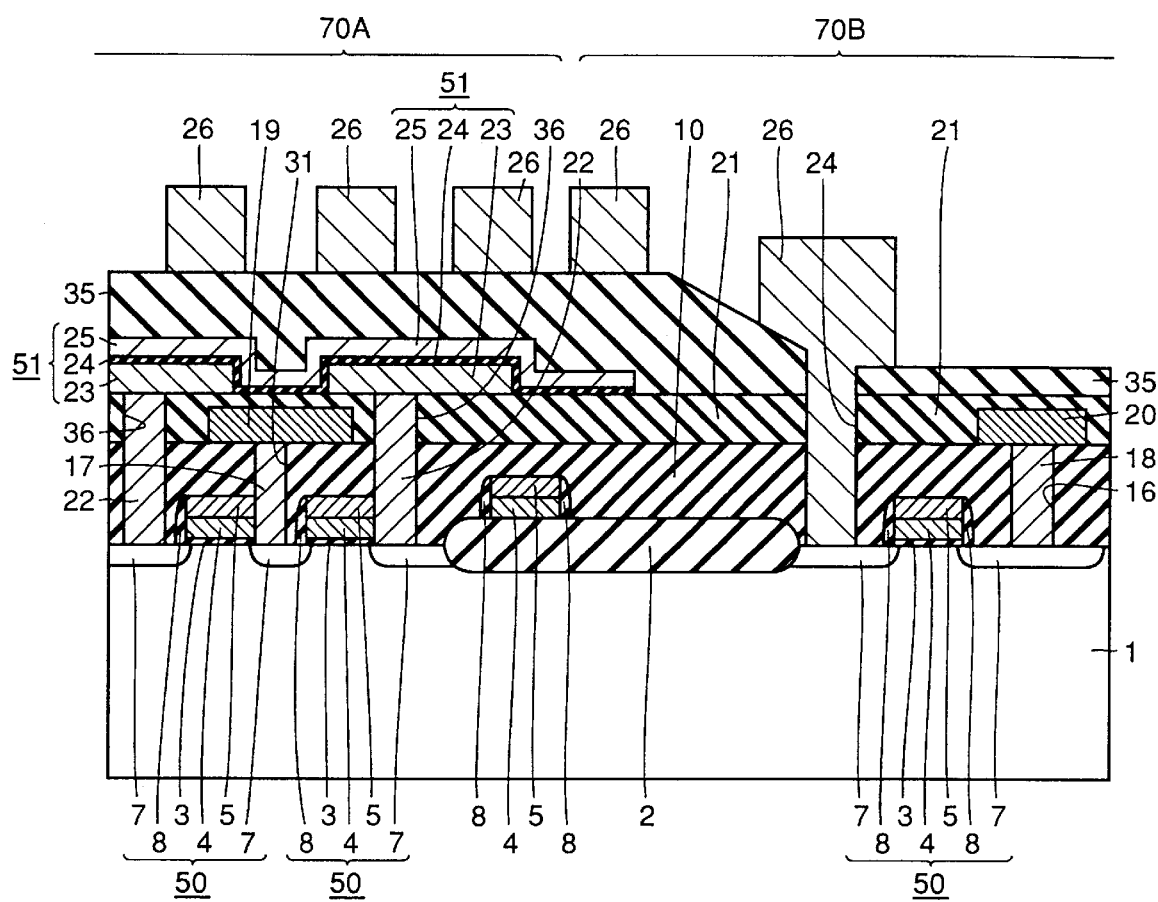
FIG. 17 is a cross-sectional view for illustrating the problem encountered in the conventional semiconductor device.

Referring to FIG. 15, in a semiconductor device according to Embodiment 5, a fifth insulation layer 30 of, for example, silicon dioxide film is formed between a first insulation layer 5 forming an anti-reflection film and a second insulation layer 9 forming a silicon nitride film or silicon oxynitride film. Fifth insulation layer 30 is formed by CVD to have a thickness of 10 to 20 nm.

When second insulation layer 9 of silicon nitride film or silicon oxynitride film is formed directly on first insulation layer (i.e., anti-reflection film) 5 and silicon substrate 1 as in Embodiment 1, there is a possibility that the surface of silicon substrate 1 is damaged, leading to induction of defects in crystal, when that second insulation layer 9 is removed by dry etching using carbon tetrafluoride gas. However, since fifth insulation layer (i.e., silicon dioxide film) 30 is formed between silicon substrate 1 and second insulation layer 9 in this Embodiment 5, there would be no disadvantage that silicon substrate 1 is damaged upon etching of second insulation layer 9.

In the present invention, the first insulation layer 5 may be one selected from the group consisting of $Si_3N_4$, SiON, $TiO_2$ and $Ta_2O_5$, the second insulation layer 9 may be one selected from the group consisting of $Si_3N_4$ and SiON, and the third insulation layer 10 may be one selected from the group consisting of $SiO_2$, PSG and BPSG.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a first interconnection layer formed on a main surface of a semiconductor substrate;
    a first insulation layer of silicon nitride or silicon oxynitride, having an upper surface and side surfaces, formed on said first interconnection layer;
    a second insulation layer of silicon nitride or silicon oxynitride formed on the upper surface and a side surface of said first insulation layer;
    a third insulation layer of silicon oxide formed on said second insulation layer;
    a second interconnection layer formed on said third insulation layer;
    a first contact hole formed between said second interconnection layer and said semiconductor substrate by etching; and
    a first conductor formed in said first contact hole, connecting said second interconnection layer and said semiconductor substrate and being electrically insulated from said first interconnection layer; wherein,
    said first insulation layer and said second insulation layer have an etching rate lower than the etching rate of said third insulation layer with respect to an etchant.

2. The semiconductor device according to claim 1, further including a fourth insulation layer between said first interconnection layer and said first insulation layer, wherein the fourth insulation layer comprises an insulating material different from that of the first insulation layer.

3. The semiconductor device according to claim 1, further including a fifth insulation layer between said first insulation layer and said second insulation layer, wherein the fifth insulation layer comprises an insulating material different from that of the first and second insulation layers.

4. The semiconductor device according to claim 1, wherein said first insulation layer and said first interconnection layer have a shape which is substantially the same in a plane view.

5. The semiconductor device according to claim 1, wherein reflectance of said first insulation layer regarding exposure light is lower than that of said first interconnection layer.

6. The semiconductor device according to claim 1, further including:
    a sixth insulation layer formed on the second interconnection layer;
    a conductive layer formed on said sixth insulation layer;
    a second contact hole formed between said conductive layer and said semiconductor substrate by etching; and
    a second conductor formed in said second contact hole, connecting said conductive layer and said semiconductor substrate and being electrically insulated from said first interconnection layer; wherein,
    said first insulation layer and said second insulation layer have an etching rate lower than the etching rate of said sixth insulation layer with respect to an etchant.

7. The semiconductor device according to claim 1, wherein
    said first contact hole includes
    a lower contact hole portion having a first diameter of opening, and
    an upper contact hole portion located above said lower contact hole portion having a second diameter of opening which is larger than said first diameter of opening.

8. The semiconductor device according to claim 6, wherein
    said conductive layer forms a capacitor lower electrode,
    said first conductor and said second interconnection layer form a bit line, and
    said first interconnection layer forms a gate electrode.

9. The semiconductor device according to claim 8, further including a capacitor upper electrode formed on the upper surface and side surface of said capacitor lower electrode with capacitor insulation film therebetween.

10. The semiconductor device according to claim 8, wherein said capacitor lower electrode and said bit line overlap each other.

11. The semiconductor device according to claim 8, wherein
    said bit line and said capacitor lower electrode form a T-shape with one another, and
    the upper portion of said capacitor lower electrode extending horizontally is formed above the upper portion of said bit line extending horizontally.

12. The semiconductor device according to claim 1, wherein
    said first insulation layer includes one selected from the group consisting of $Si_3N_4$, SiON, $TiO_2$ and $Ta_2O_5$,
    said second insulation layer includes one selected from the group consisting of $Si_3N_4$ and SiON, and
    said third insulation layer includes one selected from the group consisting of $SiO_2$, PSG and BPSG.

* * * * *